(12) United States Patent
Mizuno

(10) Patent No.: US 6,285,125 B1
(45) Date of Patent: Sep. 4, 2001

(54) STRUCTURE FOR MOUNTING AN EL LAMP

(75) Inventor: Hiromichi Mizuno, Shizuoka (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/276,159

(22) Filed: Mar. 25, 1999

(30) Foreign Application Priority Data

Mar. 27, 1998 (JP) .................................. 10-082146

(51) Int. Cl.⁷ ............................................. B05D 1/36
(52) U.S. Cl. ....................... 313/512; 313/500; 313/511
(58) Field of Search .................................. 313/500, 506, 313/512, 511; 362/84, 267, 23, 318

(56) References Cited

U.S. PATENT DOCUMENTS

| | | | |
|---|---|---|---|
| 5,756,147 | * 5/1998 | Wu et al. | 427/66 |
| 6,010,742 | * 6/2000 | Tanabe et al. | 313/512 |
| 6,082,867 | * 7/2000 | Chien | 313/512 |

FOREIGN PATENT DOCUMENTS

| | | |
|---|---|---|
| 2-56397 | 4/1990 | (JP) . |
| 5-87890 | 11/1993 | (JP) . |
| 8-221003 | 8/1996 | (JP) . |
| 9-166673 | 6/1997 | (JP) . |
| 9-331142 | 12/1997 | (JP) . |

OTHER PUBLICATIONS

Japanese Office Action, dated Oct. 26, 1999, with English language translation of Japanese Examiner's comments.
Japanese Office Action, dated Jun. 15 1999, with English Language Translation of Japanese Examiner's comments.

* cited by examiner

*Primary Examiner*—Nimeshkumar D. Patel
*Assistant Examiner*—Ken A Berck
(74) *Attorney, Agent, or Firm*—McGuireWoods LLP

(57) ABSTRACT

A structure for mounting an EL (Electro Luminescence) lamp of the present invention includes a panel frame affixed to a circuit board and receiving an LCD (Liquid Crystal Display) panel therein. The EL lamp is interposed between the panel frame and the LCD panel and includes an electrode portion connected to the circuit board by electrode terminals. Holes are formed in the EL lamp in the vicinity of the electrode portion and open at opposite major surfaces of the EL lamp. Bosses are formed in the panel frame, and each is partly received in one of the holes. Even when an unexpected impact acts on the LCD panel, the bosses prevent the EL lamp from moving in the horizontal direction. This successfully protects the electrode terminals from breakage due to fatigue and prevents them from being peeled off from the EL lamp, enhancing reliable connection both mechanically and electrically.

12 Claims, 3 Drawing Sheets

US 6,285,125 B1

STRUCTURE FOR MOUNTING AN EL LAMP

BACKGROUND OF THE INVENTION

The present invention relates to a structure for mounting an EL (Electro Luminescence) lamp advantageously applicable to a mobile communication apparatus.

Today, the popularization of various kinds of mobile communication apparatuses including handy phones and radio pagers is under way in parallel with the liberalization of electronic and communication environments. A mobile communication apparatus with an LCD (Liquid Crystal Display) is conventional and capable of displaying characters and graphic images. An EL lamp has customarily been used to illuminate the back of the LCD.

It is a common practice with the above mobile communication apparatus to position the EL lamp in an LCD frame or panel frame together with the LCD and then mount the frame to a circuit board. Specifically, the EL lamp includes an electrode portion. Metallic electrode terminals are usually connected at one end to the electrode portion of the EL lamp by anisotropic adhesive by the application of heat and pressure. The adhesive contains a conductive filler dispersed therein. The other ends of the electrode terminals are soldered to the circuit board.

The LCD is produced by dividing an LCD laminate into a number of pieces along scribe lines and therefore sized with a far greater tolerance (about ±0.2 mm) than the other parts. It follows that the panel frame is designed in matching relation to the maximum tolerance of the LCD, i.e., the LCD is received in the panel frame with a sufficient dimensional margin. To prevent the LCD from oscillating in the panel frame, the former is usually affixed to the latter together with the EL lamp by two-sided adhesive tapes.

However, the problem with the above conventional structure is that when an impact ascribable to, e.g., a drop acts on the LCD, it is transferred to the EL lamp in the panel frame. Because the EL lamp is simply adhered to the panel frame together with the LCD, the impact causes the electrode terminals to move via the EL lamp. It is therefore likely that the electrode terminals break due to fatigue or come off the EL lamp, obstructing reliable connection both mechanically and electrically.

While Japanese Utility Model Laid-Open Publication No. 5-87890 teaches an EL lamp mounting structure, it cannot solve the problem discussed above.

Technologies relating to the present invention are also disclosed in Japanese Patent Laid-Open Publication Nos. 8-221003 and 9-166673.

SUMMARY OF THE INVENTION

It is therefore an object of the present invention to provide an EL lamp mounting structure capable of protecting electrode terminals from breakage or separation to thereby insure reliable connection both mechanically and electrically.

In accordance with the present invention, a structure for mounting an EL lamp includes a panel frame affixed to a circuit board and receiving an LCD panel therein, and an EL lamp interposed between the panel frame and the LCD panel and including an electrode portion connected to the circuit board by electrode terminals. A plurality of holes are formed in the EL lamp in the vicinity of the electrode portion and open at opposite major surfaces of the EL lamp. A plurality of bosses are formed on the panel frame, and each is partly received in one of the holes.

Also, in accordance with the present invention, a structure for mounting an EL lamp includes a panel frame affixed to a circuit board and receiving an LCD panel therein, and an EL lamp interposed between the panel frame and the LCD panel and including an electrode portion connected to the circuit board by electrode terminals. A plurality of holes are formed in the EL lamp in the vicinity of the electrode portion and open at opposite major surfaces of the EL lamp. A plurality of knock pins each are partly received in one of the holes.

BRIEF DESCRIPTION OF THE DRAWINGS

The above and other objects, features and advantages of the present invention will become more apparent from the following detailed description taken with the accompanying drawings in which.

In the drawings, identical reference numerals designate identical structural elements.

DESCRIPTION OF THE PREFERRED EMBODIMENTS

Figure 1A:
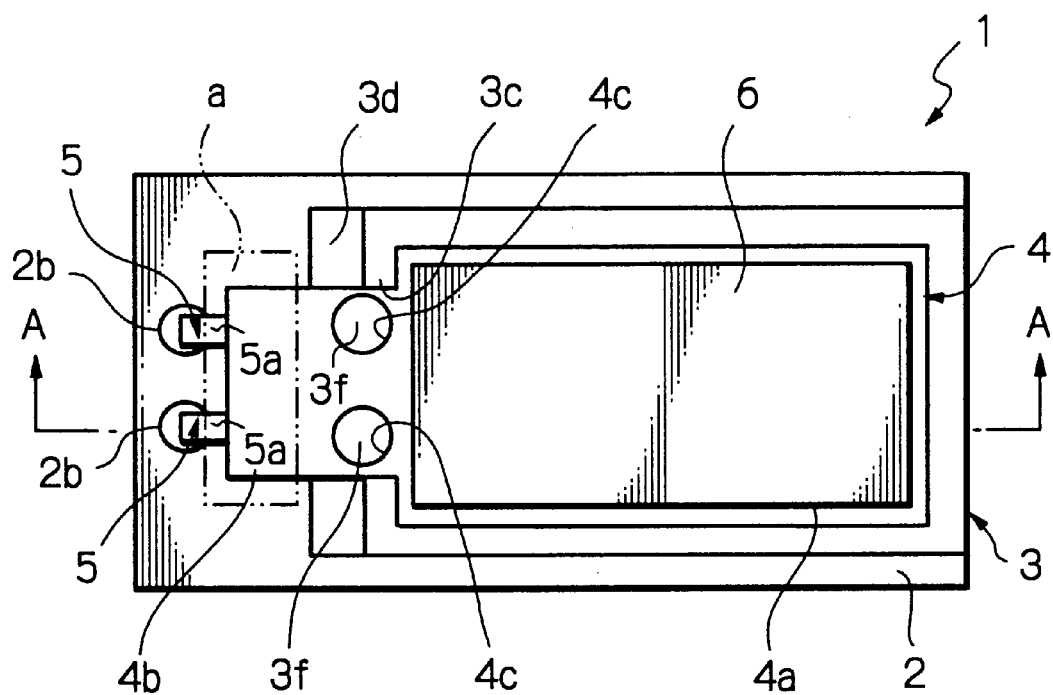
FIG. 1A is a front view showing a structure for mounting an EL lamp embodying the present invention.
Figure 1B:
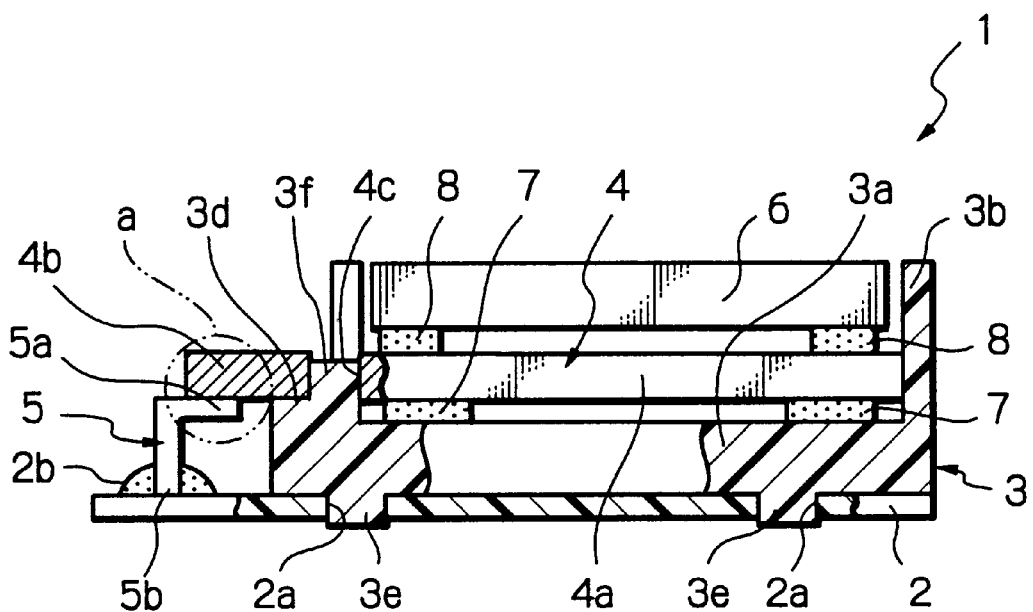
FIG. 1B is a sectional view along line A—A of FIG. 1B.

Referring to FIGS. 1A and 1B, a structure for mounting an EL lamp embodying the present invention is shown and applied to a mobile communication apparatus by way of example. The structure, generally 1, is made up of a circuit board 2, a panel frame 3, an EL lamp 4, electrode terminals 5, and an LGD panel 6. The circuit board 2 is formed with a plurality of positioning holes 2a extending throughout the circuit board 2. The holes 2a are used to position the panel frame 3 relative to the circuit board 2 in the horizontal direction.

The panel frame 3 is affixed to the circuit board 2 and implemented as a rectangular box having a bottom wall portion 3a and side-wall portion 3b. The panel frame 3 is formed of metal or synthetic resin by way of example. The sidewall portion 3b of the panel frame 3 is partly removed to form a notch 3c. The panel frame 3 has a stepped portion 3d at its one edge portion on which the electrode portion of the EL lamp 4 rests, as will be described later specifically.

Lugs 3e protrude form one major surface of the panel frame 3 opposite to the other major surface facing the EL lamp 4. The lugs 3e are respectively received in the positioning holes 2a of the circuit board 2, so that the panel frame 3 is positioned relative to the circuit board 2 in the horizontal direction.

Two parallel bosses 3f protrude from the major surface of the panel frame 3 facing the EL lamp 4, and each has a circular cross-section. The bosses 3f are spaced from each other by a preselected distance and used to position the EL lamp 4 relative to the circuit board 2 in the horizontal direction.

The EL lamp 4 is positioned between the bottom portion 3a of the panel frame 3 and the back of the LCD panel 6. The EL lamp 4 includes a lamp body 4a for illuminating the back of the LCD panel 6, and an electrode portion 4b connected to one end portion of each electrode terminal 5. The lamp body 4a is affixed to the bottom portion 3a by two-sided adhesive tapes 7 and positioned within the sidewall portion 3b. The electrode portion 4b is partly exposed to the outside of the panel frame 3 via the notch 3c. Holes 4c extend throughout the EL lamp 4 in the vicinity of the electrode portion 4b for receiving the bosses 3f of the panel frame 3.

Each electrode terminal 5 is a generally L-shaped piece made up of a horizontal portion 5a and a vertical portion 5b. The horizontal portion 5a is bonded to the electrode portion 4b of the EL lamp 4 by anisotropic conductive adhesive by the application of heat and pressure at a position indicated by a dash-and-dots circle a in FIG. 1B. The vertical portion 5b is soldered to one of two electrode portions 2b included in the circuit board 2.

The LCD panel 6 is received in the panel frame 3 and affixed to the EL lamp 4 by two-sided adhesive tapes 8.

Assume that an unexpected force tending to move the LCD panel 6 in the horizontal direction acts on the above assembly due to an impact ascribable to, e.g., a drop. Then, although the force is transferred from the LCD panel 6 to the EL lamp 4, the bosses 3f of the panel frame 3 prevent the EL lamp 4 from moving in the horizontal direction.

As stated above, the illustrative embodiment frees the EL lamp 4 from displacement ascribable to an impact transferred from the LCD panel 6. This successfully protects the electrode terminals 5 from breakage due to fatigue and prevents them from being peeled off from the EL lamp 4.

Further, the bosses 3f of the panel frame 3 positioned on the circuit board 2 are respectively received in the holes 4c of the EL lamp 4. Therefore, when the EL lamp 4 is mounted to the panel frame 3, the bosses 3f serve to accurately position the EL lamp 4.

Figure 2A:
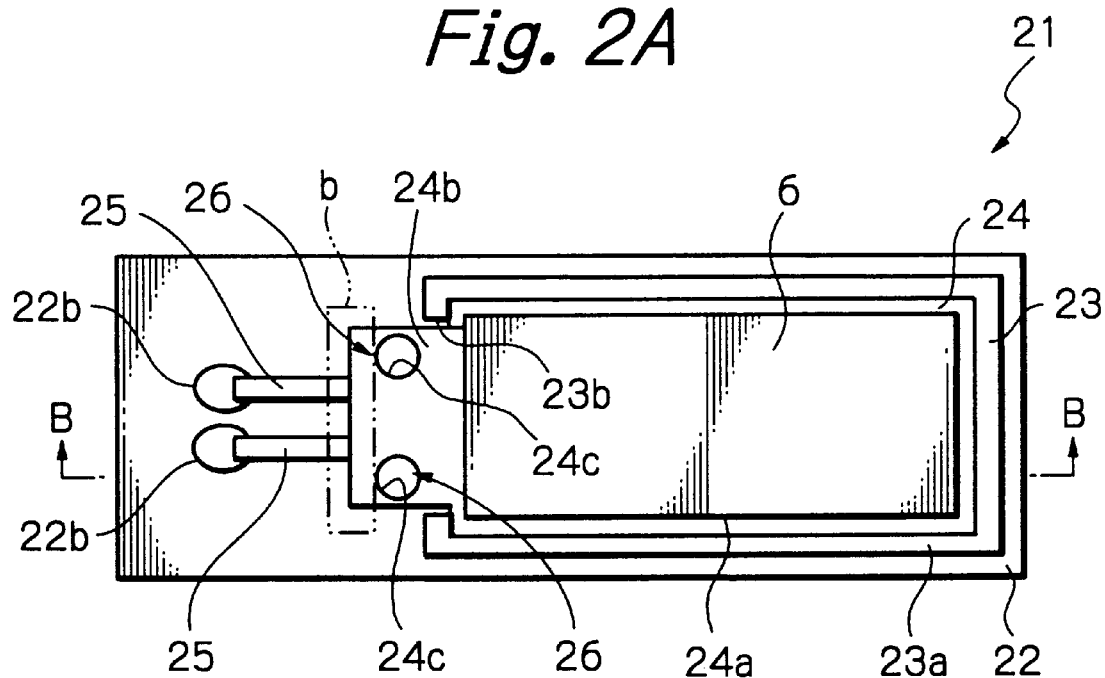
FIG. 2A is a front view showing an alternative embodiment of the present invention.
Figure 2B:
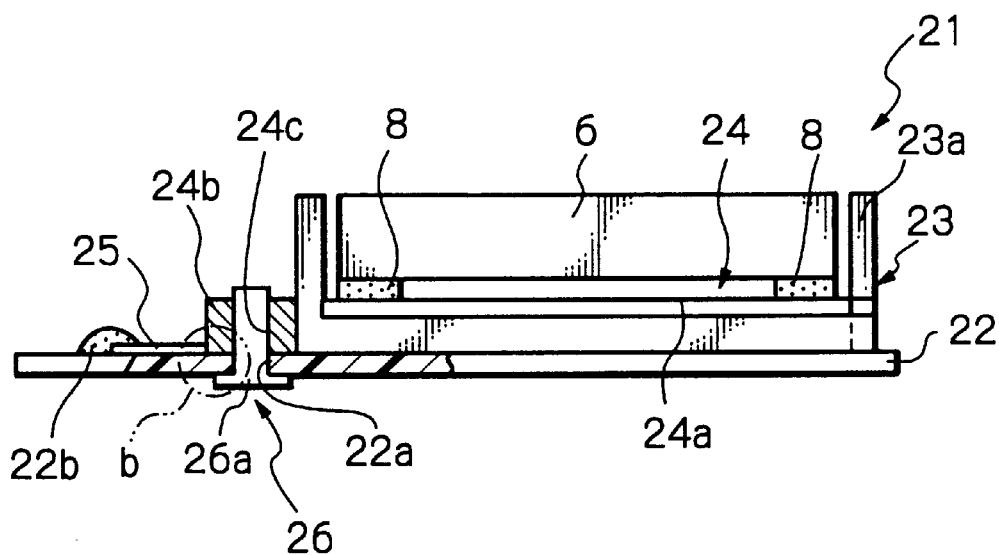
FIG. 2B is a sectional view along line B—B of FIG. 2A.

Reference will be made to FIGS. 2A and 2B for describing an alternative embodiment of the present invention, which is also applied to a mobile communication apparatus. As shown, an EL lamp mounting structure includes a circuit board 22, a panel frame 23, an EL lamp 24, electrode terminals 25, knock pins 26, and the LCD panel 6. Positioning holes 22a extend throughout the circuit board 22 for receiving the nock pins 26.

The panel frame 23 is affixed to the circuit board 22 and generally implemented as a rectangular frame having a sidewall portion 23a. The panel frame 23 is formed of metal or synthetic resin by way of example. The sidewall portion 23a of the panel frame 23 is partly removed to form a notch 23b.

The EL lamp 24 includes a lamp body 24a for illuminating the back of the LCD panel 6, and an electrode portion 24b connected to one end portion of each electrode terminal 25. The lamp body 24a is mounted on the circuit board 22 and positioned within the sidewall portion 23a. The electrode portion 24b is partly exposed to the outside of the panel frame 23 via the notch 23b. Holes 24c extend throughout the EL lamp 24 in the vicinity of the electrode portion 24b, and each receives a part of one of the knock pins 26.

Each electrode plate 25 is a generally l-shaped rectangular piece. The electrode plate 25 is connected at one end to the electrode portion 24b of the EL lamp 24 by anisotropic conductive adhesive by the application of heat and pressure at a position indicated by a dash-and-dot circle b in FIG. 2B. The other end of the electrode 25 is soldered to one of two electrode portions 22b included in the circuit board 22.

Each knock pin 26 is formed of metal or synthetic resin by way of example and includes a flange 26ª. The knock pins 26 are respectively passed through the holes 24c of the EL lamp 24 and the holes 22a of the circuit board 22. The knock pins 26 are affixed to the circuit board 22 with their flanges 26a thereof abutting against the surface of the circuit board 22 opposite to the surface facing the panel frame 23.

Assume that an unexpected force tending to move the LCD panel 6 in the horizontal direction acts on the above assembly due to an impact ascribable to, e.g., a drop. Then, although the force is transferred from the LCD panel 6 to the EL lamp 24, the knock pins 26 prevent the EL lamp 24 from moving in the horizontal direction.

As stated above, this embodiment also frees the EL lamp 24 from displacement ascribable to an impact transferred from the LCD panel 6. This successfully protects the electrode terminals 25 from breakage due to fatigue and prevents them from being peeled off from the EL lamp 24.

Further, the knock pins 26 are respectively received in the holes 24c of the EL lamp 24. Therefore, when the EL lamp 24 is mounted to the circuit board 22, the knock pins 26 serve to accurately position the EL lamp 24, as in the previous embodiment.

Figure 3A:
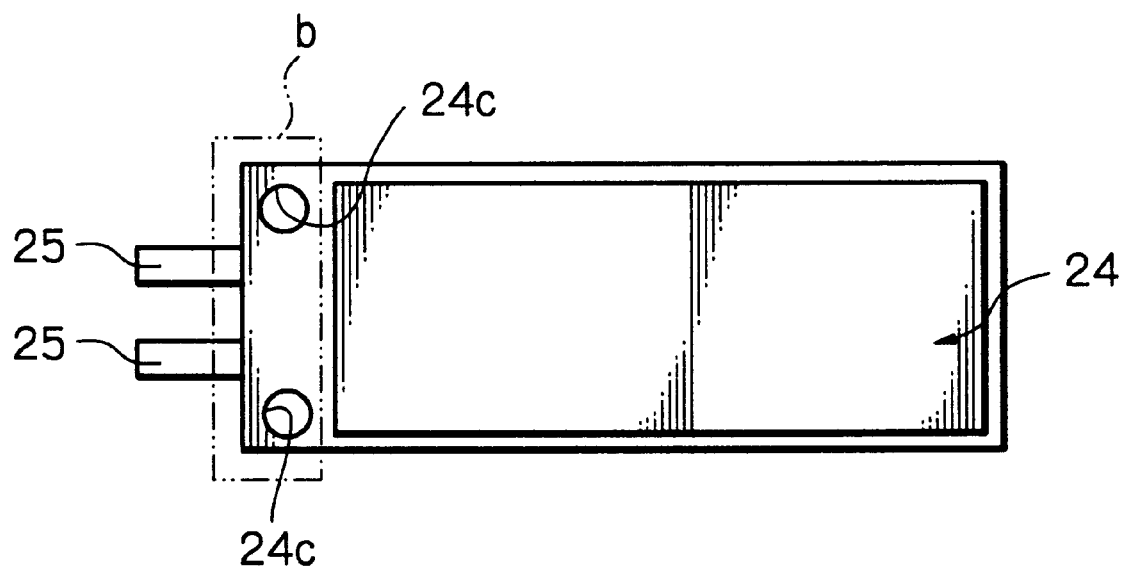
FIG. 3A is a front view showing another alternative embodiment of the present invention.
Figure 3B:
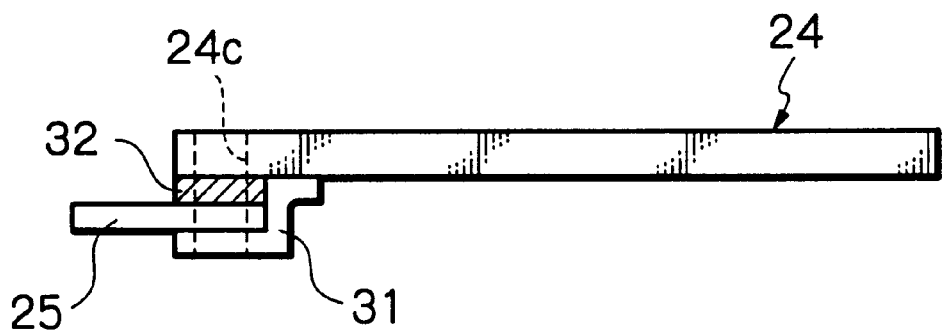
FIG. 3B is a bottom view of the embodiment shown in FIG. 3A.

In the above embodiment, the electrode portion 24b of the EL lamp 24 is directly adhered to the electrode terminals 25 of the circuit board 22 by anisotropic conductive adhesive. FIGS. 3A and 3B show another alternative embodiment of the present invention in which a heat seal 31 is positioned between the back of the EL lamp 24 (facing the circuit board not shown) and the front of the circuit board (facing the EL lamp 24). The heat seal 31 protects the circuit board 22 from the influence of heat ascribable to the anisotropic conductive adhesive 32.

While the illustrative embodiments have concentrated on a mobile communication apparatus, the present invention is, of course, applicable to any other electronic apparatus of the type including an EL lamp received in a panel frame together with an LCD panel and mounted to a circuit board via electrode terminals.

In summary, in accordance with the present invention, even when an unexpected impact acts on an LCD panel, bosses protruding from a panel frame and received in the holes of an EL lamp prevent the EL lamp from moving in the horizontal direction. It follows that the impact is prevented from being transferred from the LCD panel electrode terminals via the EL lamp. This successfully protects the electrode terminals from breakage due to fatigue and prevents them from being peeled off from the EL lamp, enhancing reliable mechanical and electrical connection.

Further, when the EL lamp is mounted to the panel frame, the bosses received in the holes of the EL lamp serve to accurately position the EL lamp. This promotes efficient and accurate assembly work.

Various modifications will become possible for those skilled in the art after receiving the teachings of the present disclosure without departing from the scope thereof.

What is claimed is:

1. A structure for mounting an EL lamp, comprising:
   a panel frame affixed to a circuit board and receiving a LCD panel therein;
   an EL lamp interposed between said panel frame and said LCD panel, said EL lamp including an electrode portion connected to said circuit board by a plurality of electrode terminals;
   a plurality of holes formed in said EL lamp in the vicinity of said electrode portion and open at opposite major surfaces of said EL lamp; and a plurality of bosses formed on said panel frame, said bosses each being partly received in a respective one of said plurality of holes.

2. A structure as claimed in claim 1, wherein said plurality of electrode terminals are connected to said EL lamp by anisotropic conductive adhesive by applying heat and pressure.

3. A structure as claimed in claim 2, wherein said plurality of electrode terminals each comprise a bent piece made up of a horizontal portion connected to said electrode portion of said EL lamp and a vertical portion connected to said circuit board.

4. A structure as claimed in claim 3, wherein said plurality of holes comprise two holes spaced from each other by a preselected distance.

5. A structure as claimed in claim 4, wherein said plurality of holes are formed in said circuit board and open at one of opposite major surfaces of said circuit board facing said panel frame, said panel frame including a plurality of lugs respectively received in said plurality of holes.

6. A structure as claimed in claim 1, wherein said plurality of electrode terminals each comprise a bent piece made up of a horizontal portion connected to said electrode portion of said EL lamp and a vertical portion connected to said circuit board.

7. A structure as claimed in claim 6, wherein said plurality of holes comprise two holes spaced from each other by a preselected distance.

8. A structure as claimed in claim 7, wherein a plurality of holes are formed in said circuit board and open at one of opposite major surfaces of said circuit board facing said panel from, said panel frame including a plurality of lugs respectively received in said plurality of holes.

9. A structure as claimed in claim 1, wherein said plurality of holes comprise two holes spaced from each other by a preselected distance.

10. A structure as claimed in claim 9, wherein a plurality of holes are formed in said circuit board and open at one of opposite major surfaces of said circuit board facing said panel frame, and said panel frame includes a plurality of lugs respectively received in said plurality of holes.

11. A structure as claimed in claim 1, wherein a plurality of holes are formed in said circuit board and open at one of opposite major surfaces of said circuit board facing said panel frame, said panel frame including a plurality of lugs respectively received in said plurality of holes.

12. A structure for mounting an EL lamp, comprising:

a panel frame affixed to a circuit board and receiving a LCD panel therein;

an EL lamp interposed between said panel frame and said LCD panel, and said EL lamp including an electrode portion connected to said circuit board by electrode terminals;

a plurality of holes formed in said EL lamp in the vicinity of said electrode portion and open at opposite major surfaces of said EL lamp; and a plurality of knock pins each being partly received in a respective one of said plurality of holes.

* * * * *